United States Patent [19]

Nakayama

[11] Patent Number: 4,521,740
[45] Date of Patent: Jun. 4, 1985

[54] BIAS CURRENT COMPENSATED AMPLIFIER

[75] Inventor: Kazuaki Nakayama, Tokyo, Japan

[73] Assignee: Pioneer Electronic Corporation, Tokyo, Japan

[21] Appl. No.: 467,637

[22] Filed: Feb. 18, 1983

[51] Int. Cl.³ .............................................. H03F 3/26
[52] U.S. Cl. .................................... 330/267; 330/270
[58] Field of Search ............... 330/267, 268, 270, 271, 330/273, 146

[56] References Cited

U.S. PATENT DOCUMENTS 4,370,623   1/1983   Nagasawa .................... 330/270 X Primary Examiner—James B. Mullins
Assistant Examiner—Steven J. Mottola
Attorney, Agent, or Firm—Sughrue, Mion, Zinn Macpeak & Seas

[57] ABSTRACT

An amplifier output circuit in which crossover distortion is largely eliminated, temperature compensation of idle current is obviated, and the idle current is maintained stable, independent of the magnitude of the input signal. In one embodiment in which two output amplifying elements are connected in a Class B SEPP circuit configuration, first and second error signal amplifiers are provided. While the first error amplifier functions as an error amplifier for an error voltage level shifted between the voltage at the output electrode of its current amplifying element and the voltage at the circuit input terminal, the second error amplifier functions as an error amplifier for an error voltage level shifted between the voltage at the output terminal of its amplifying element and the voltage at the circuit output terminal. On the other hand, while the second error amplifier is functioning as an error amplifier for the error voltage level shifted between the voltage at the output electrode of the second amplifying element and the voltage at the circuit input terminal, the first error amplifier functions as an error amplifier for an error signal level shifted between the voltage at the output terminal of the first amplifying element and the voltage at the circuit output terminal. In another embodiment, a bridge circuit is coupled between the output terminal of the circuit and the output electrode of the output amplifying element. In this case, the bias of the output amplifying element is controlled in accordance with the difference between the input signal level shifted and the voltage detected by the bridge circuit.

10 Claims, 15 Drawing Figures

BIAS CURRENT COMPENSATED AMPLIFIER

BACKGROUND OF THE INVENTION

The present invention relates to a non cut-off, Class B, emitter-follower, single-ended push-pull (SEPP) circuit.

An emitter-follower type SEPP circuit is generally operated in Class B from a point of view of efficiency. In such a circuit, it is essential to pass an idle current through the output transistors in order to smoothly interconnect the upper and lower (positive and negative half cycles) transfer characteristics, that is, to reduce crossover distortion. In an ordinary circuit of this type, crossover distortion may occur since one of transistors will be turned on when the other of the transistors is cut off. To eliminate this problem, recently a non cut-off Class B circuit has been used in which such cut-off is not permitted due to the provision of a constant idle current which always flow in the otherwise nonconducting transistor. A servo circuit is used to generate this idle current. With this construction, crossover distortion is indeed reduced. However, this approach does nothing regarding current distortion arising from the non-linearity of the current transfer characteristic and voltage distortion due to the exponential transfer characteristics of the transistor.

Further, there is a disadvantage in that thermal runaway can occur if the idle current is not fully compensated for. In the prior art arrangement, the idle current alters little with changes in signal levels and ambient temperature. Thus, the circuit's operating point can shift either over long or short times.

Further, it is extremely difficult to design such a circuit since the above-mentioned thermal compensation is very sensitive. Particularly, the design is made difficult in a conventional non cut-off Class B circuit which does not utilize feedback. In any event, temperature compensation cannot be complete in any such circuit design.

FIG. 1 shows the basic construction of a conventional non cut-off Class B SEPP circuit. In this figure, symbols $A_1$ and $A_2$ designate error amplifiers having a gain less than one, $B_1$ and $B_2$ voltage generating circuits which may be voltage adders, C an input signal source, and $V_B$ a bias voltage for bipolar transistors $Q_1$ and $Q_2$.

In FIG. 1, an idle current $I_d$ is composed of currents $i_{E1}$ and $i_{E2}$, which are present when no signal is applied to an input terminal IN. Currents $I_{B1}$ and $I_{B2}$ are supplied from a power source $V_B$. With the base-emitter voltage of each transistor being $V_{BE}$ and the emitter resistance thereof $R_E$, the following equation can be written:

$$I_d = \frac{V_B - V_{BE}}{R_E}. \quad (1)$$

When an input signal current $i_i$ flows, the current $i_{E1}$ is increased. Assuming that the current amplification factor of the transistor $Q_1$ is $h_{fe1}$, the following equation is obtained:

$$i_{E1} = h_{fe1} \cdot i_i.$$

This current $i_{E1}$ produces a voltage across the resistor $R_E$. The input voltage $V_{i1}$ to the amplifier $A_1$ then becomes:

$$V_{i1} = (V_{BE} - V_B) + i_{E1} R_E = (V_{BE} - V_B) + h_{fe1} i_i R_E.$$

The presence of this voltage causes the base of the transistor $Q_2$ to be biased reversely and would cut-off the transistor if the amplifier $A_1$ were not provided. If the gain of the amplifier $A_1$ is set to one, the voltage $V_{i1}$ is positively fed back to the base of the transistor $Q_1$ as it is, raising the input voltage to the transistor $Q_1$. Thus, a constant idle current ($I_d$) will always be provided without reversely biasing the transistor $Q_2$. A quite similar operation is carried out if the input current $i_i$ is reversed to flow in the direction in which the transistor $Q_2$ is turned on.

FIG. 2 shows a current transfer characteristic with respect to the input signal current $i_i$ in the circuit of FIG. 1. Generally, as the emitter current of a transistor increases at high current levels, $h_{fe}$ (current amplification factor) decreases, and hence the resultant characteristic is considerably non-linear, resulting in a large amount of current distortion. Moreover, if the gains of the amplifiers $A_1$ and $A_2$ are set to one as described above, the positive feedback ratio will be 100% and the stabilizing effect of the resistor $R_E$ will be completely lost ($R_E$ becomes zero in equation (1)). Therefore, the idle current $I_d$ becomes unstable and oscillations may occur. Practically, the gains of the transistors are set to values less than one, but the circuit is still quite unstable with respect to temperature.

If a non cut-off Class B circuit configuration is not employed, and instead constant voltage driving is effected by dispensing with amplifiers $A_1$ and $A_2$ in FIG. 1 in an attempt to reduce the distortion due to the non-linear current transfer characteristic, the transfer characteristic will be as shown in FIG. 3. Even in this case, however, distortion due to the exponential transfer characteristics of transistors remains.

Thus, in a conventional Class B SEPP circuit employing constant voltage driving, (1) crossover distortion due to the exponential transfer characteristic and distortion due to the on-off operations of the output transistors occurs. Even if a non cut-off Class B SEPP circuit using constant current driving is used, (2) distortion due to a nonlinear current transfer characteristic occurs. Further, irrespective of the driving method, (3) temperature compensation for the idle current is necessary, but complete compensation is impossible. Also, (4) times longer than several tens of minutes are needed until the idle current becomes constant after power is applied. Still further, (5) the idle current fluctuates with the presence and absence of the input signal, and the magnitude of the idle current deviates greatly from a set value when a large signal is present. Finally, (6) the operating point becomes unstable and varies with ambient temperature and the presence and absence of the input signal due to the above-mentioned disadvantages (3) to (5).

To obviate the above-mentioned disadvantages, it is an object of the present invention to provide a non cut-off, Class B, emitter-follower SEPP circuit which has extremely small distortion and in which it is completely unnecessary to temperature compensate the idle current.

Further, the adjustment of the idle current setting of an output amplifying element in an SEPP type amplifier has heretofore been carried out mainly by manually adjusting a variable resistor. Because the idle current setting circuit includes a thermal compensating element such as a varistor or a thermistor, the idle current will vary with time and temperature. Typically, several to several tens of minutes are needed for reaching a constant idle current state after power has been applied. Further, there is a disadvantage in that so-called thermal distortion (thermal cross-modulation distortion) can result from fluctuations of the operating point due to level changes of an input signal. Even if a push-pull arrangement in which the transistors are operated in Class A is employed, odd-order harmonics of the input signal are amplified (although even-order harmonics are suppressed to a certain degree).

In view of the foregoing, another object of the present invention is to provide a bias control circuit for an amplifier capable of stabilizing a transistor amplifier circuit by maintaining the DC idle current of an amplifying element substantially constant independent of temperature, and which is thus capable of reducing crossover distortion, switching distortion and the like.

SUMMARY OF THE INVENTION

In accordance with the above and other objects of the invention, there is provided an amplifier circuit having a non cut-off, Class B, emitter-follower SEPP configuration having an extremely small distortion factor, and in which it is unnecessary to temperature compensate the idle current. Specifically, in accordance with the invention, first and second error amplifiers, one for the positive half cycle and the other for the negative half cycle, are provided, each of which has three input terminals, two noninverting input terminals and a single inverting input terminal. The single inverting input terminal of each is connected to the output electrode of the corresponding amplifying element. The output electrodes of the amplifying elements are connected through loads, which may be resistive loads or current mirror circuit loads, to an output terminal. Thus, a voltage is applied to the noninverting input terminals of the error amplifiers representing the magnitude of the idle current flowing in the respective amplifying elements. The first noninverting input terminals of each of the error amplifiers receive the input signal level shifted by a predetermined value, while the second noninverting input terminals receive the output signal, also level shifted by a predetermined value. The outputs of the error amplifiers are summed with the input signal for application to the input electrodes of the amplifying elements.

Further in accordance with the invention, there is provided an amplifying circuit in which a bridge circuit is interposed between the output electrodes of the amplifying elements and an output terminal. An error amplifier generates an error output signal representing the difference as a voltage proportional to the input signal level and an output voltage detected by the bridge circuit. A variable bias circuit controls the DC bias of the amplifying element in accordance with the error signal thereby produced. With this arrangement, it is not necessary to provide any temperature compensating element such as a varistor or a thermistor. Further, no idle current adjustment is required since the DC bias current of the amplifying element is always maintained constant.

DESCRIPTION OF THE PREFERRED EMBODIMENT

Figure 4:
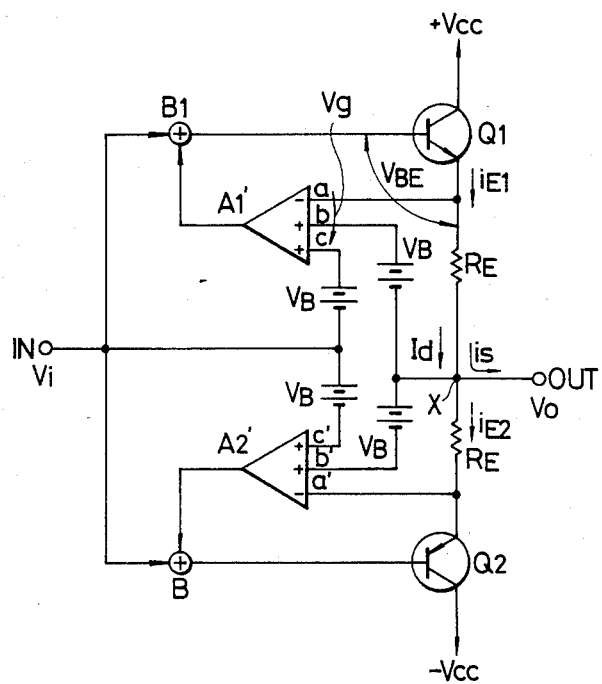
FIG. 4 is circuit diagram showing a circuit configuration of the present invention.

FIG. 4 shows the basic construction of an SEPP circuit according to the present invention including error amplifiers $A_1'$ and $A_2'$ having three input terminals a to c and a' to c', respectively. Emitters of the transistors $Q_1$ and $Q_2$ are connected to each other through resistors $R_E$, and the junction point of the two resistors is connected to an output terminal OUT. The emitters of the transistors $Q_1$ and $Q_2$ are connected to input terminals a and a' of the error amplifiers $A_1'$ and $A_2'$, respectively. The input terminals c and c' are connected to an input terminal IN through bias sources $V_B$. The junction point of the two resistor $R_E$ is connected to remaining input terminals b and b' of the amplifier $A_1'$ and $A_2'$ through bias sources $V_B$. Outputs of the amplifiers $A_1'$ and $A_2'$ are applied to voltage generating circuits $B_1$ and $B_2$, composed of voltage adders, with which the outputs of the amplifiers $A_1'$ and $A_2'$ are summed with the input signal.

The amplifiers $A_1'$ renders the input terminal b open, that is, makes the impedance imposed on the terminal by the amplifier essentially infinite so that the signal on the terminal b has no effect on the amplifier output, when a negative signal with respect to the input terminals a to c thereof is applied to the terminal b. Further, the amplifier $A_1'$ renders the input terminal c open when a negative signal is applied with respect to the input terminals b and a. In a similar fashion, the amplifiers $A_2'$ renders the input terminal b' thereof open when a positive input signal with respect to the input terminals a' to c', is applied to the terminal b', while it renders the terminal c' open when a positive input signal is applied with respect to the input terminals a' and b'.

With the above arrangement, there are formed feedback loops having the terminals a and a', and c and c', of the amplifiers $A_1'$ and $A_2'$ as input terminals. Thus, the idle current $I_d$ when no input signal is present can be represented as:

$$I_d = \frac{V_B}{R_E}. \qquad (2)$$

When a positive signal is inputted and an negative signal equal to $i_s \cdot R_E$ is forcibly applied between the terminals a and c, the input terminal b is opened. Thus, assuming that the gain of the amplifier $A_1'$ is $\alpha$, an input voltage $V_i$ with respect to the signal component becomes:

$$V_i = V_o + \Delta V_{BE} + i_s R_E - \alpha v_g, \quad (3)$$

where $V_o$ represents an output voltage, $\Delta V_{BE}$ a change of $V_{BE}$, $i_s$ the signal current and $V_g$ represents an input voltage between terminals a and c, which can be expressed as:

$$V_g = V_i - (V_o + i_s R_E). \quad (4)$$

Equation (4) is substituted into equation (3) to obtain the following equation:

$$V_i = V_o + \Delta V_{BE} + i_s R_E - \alpha[V_i - (V_o + i_s R_E)] =$$
$$V_o + \Delta V_{BE} + i_s R_E - \alpha V_i + \alpha V_o + \alpha i_s R_E.$$

By rearranging this equation, $V_o$ is obtained as:

$$V_o = V_i - i_s R_E - \frac{\Delta V_{BE}}{1 + \alpha}. \quad (5)$$

In equation (5), if $\alpha$ becomes large, the effect of $V_{BE}$, which is a term representing distortion due to exponential transfer characteristic, is nullified. Therefore, in the case of a linear load, $i_s$ will not be distorted, and hence $V_i$ and $V_o$ become analogous, that is, they track one another, thereby largely eliminating distortion.

On the other hand, regarding the operation of the amplifier $A_2'$, the input terminal c' is opened since a signal positive by approximately $(i_s R_E + V_G)$ is forcibly applied with respect to the terminals b' and a'. Therefore, the amplifier $A_2'$ acts as an error amplifier having the terminals b' and a' as its inputs. The idle current then becomes as follows:

$$I_d = \frac{V_B}{R_E},$$

which is the same result as in equation (2) above.

When a negative signal is inputted to the input terminal IN, a quite smaller operation is carried out, only the sign of the various signals is changed.

Figure 5:
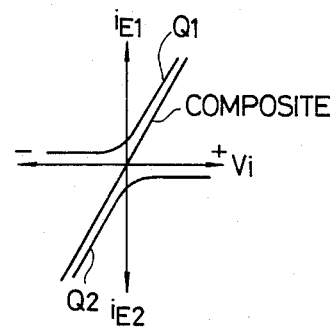
FIG. 5 is a graph showing a characteristic of the circuit of FIG. 5.

The circuit of FIG. 4 as a transfer characteristic as shown in FIG. 5, which is that of a non cut-off Class B SEPP circuit in which the resultant characteristic is linear.

Figure 6:
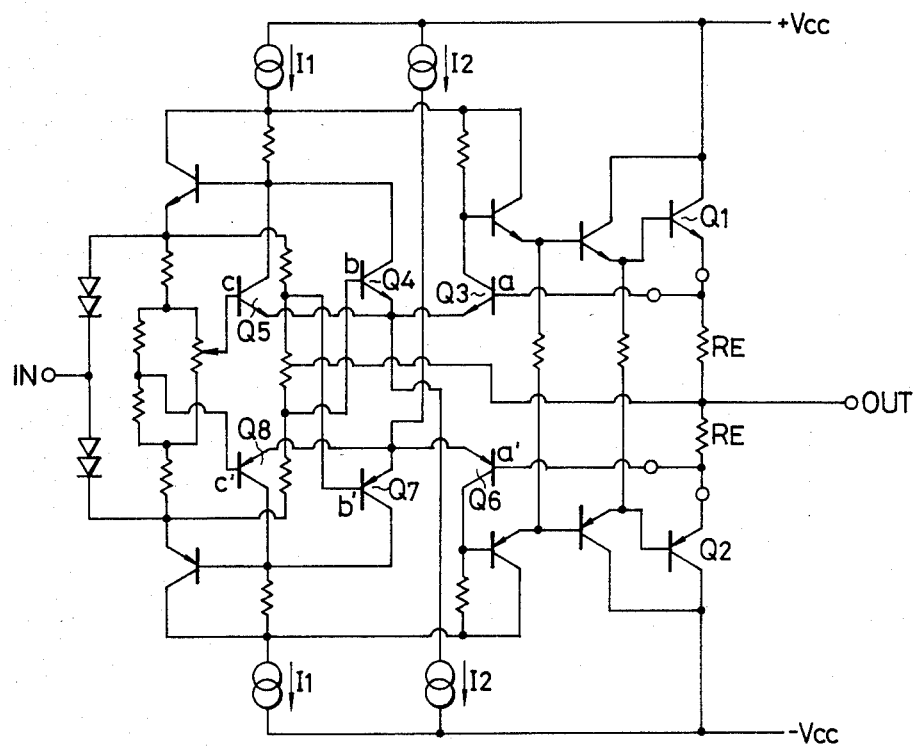
FIG. 6 is a circuit diagram of a specific implementation of the circuit of FIG. 4.

FIG. 6 shows a specific implementation of the circuit of FIG. 4, wherein the error amplifier $A_1'$ is constituted by transistors $Q_3$ and $Q_5$, the respective bases of which correspond to the input terminals a and c. The error amplifier $A_2'$ is constituted by transistors $Q_6$ and $Q_8$, the respective bases of which correspond to the input terminals a' and c'. $I_1$ and $I_2$ are constant current sources having output current in the relation of $I_1 > I_2$.

Figure 7:
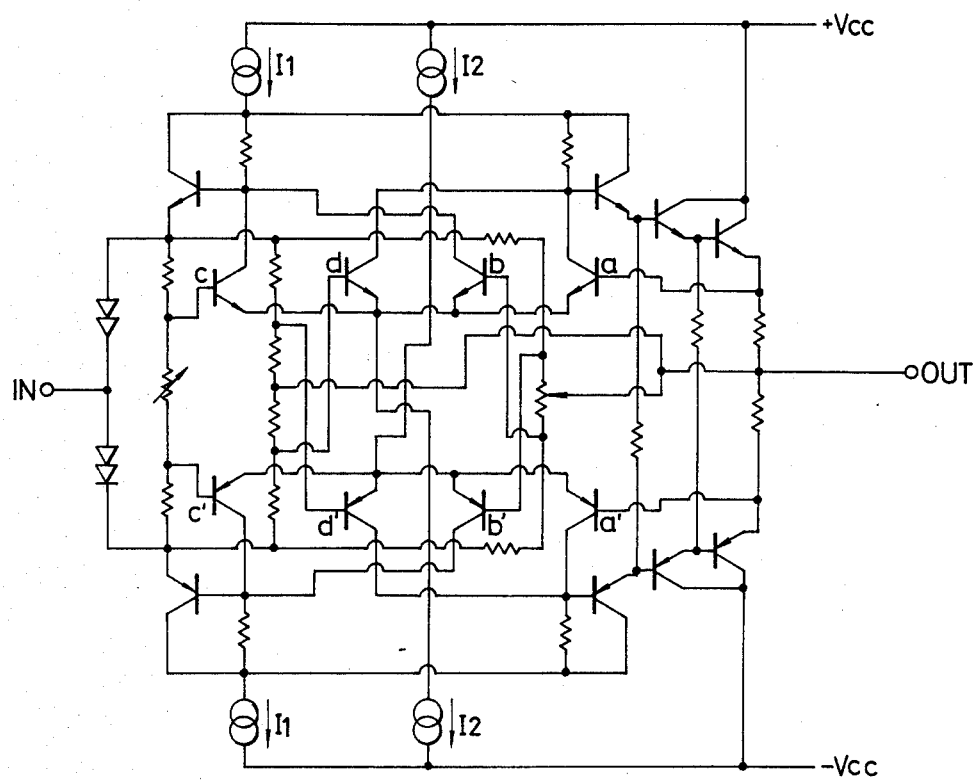
FIGS. 7 and 8 are circuit diagrams showing other specific implementations of the circuit of FIG. 4.

FIG. 7 shows another specific implementation employing four input terminal type error amplifiers. In this example, an effectively ideal error amplifier is provided by balancing the error amplifiers.

Figure 8:
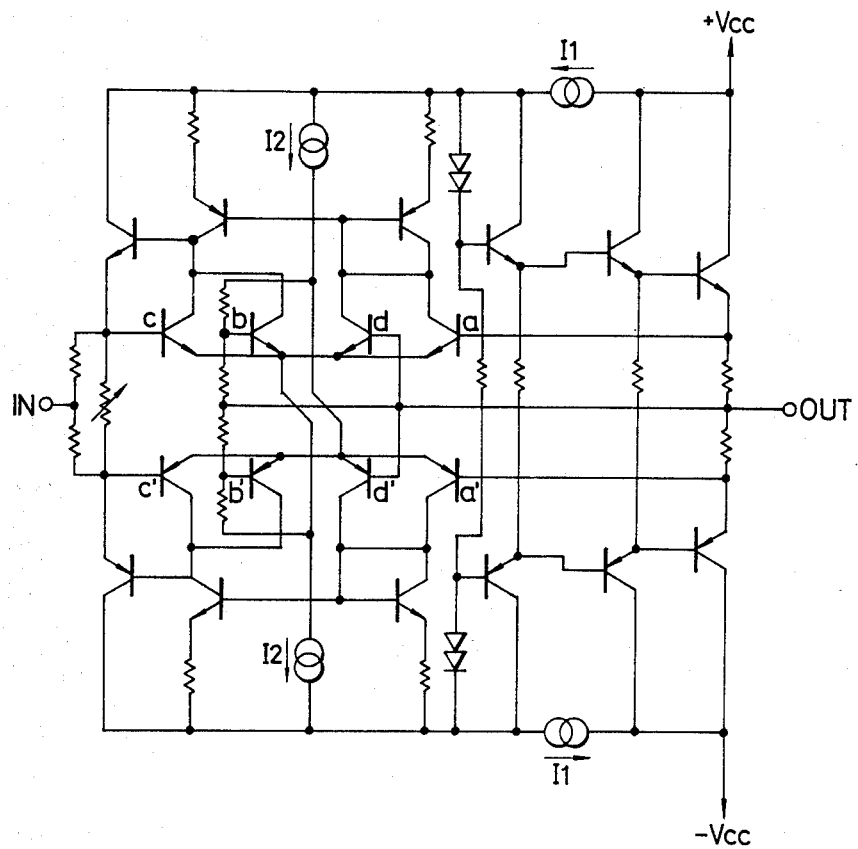

FIG. 8 shows a circuit obtained by replacing the resistive load of the error amplifiers in FIG. 7 with current mirror circuit loads, which circuit has a large gain and is suitable for fabrication as an integrated circuit.

In every case mentioned above, biases applied between the terminals c or c' and b or b', or d or d', are set at a value which will provide a desired magnitude of idle current, and are not necessarily restricted to a value of $V_B$ as used in the circuit of in FIG. 4.

Further, even if the constant voltage driving point (the input terminal in FIGS. 6, 7 and 8) is opened and $I_1$ is converted to an input signal source, i.e., a constant current driving circuit, there will be obtained a stabilized SEPP circuit including features of idle current servo control and non cut-off Class B operation.

Further, the first and second amplifying elements may have Darlington constructions.

As described above, according to the present invention, the idle current and distortion components of the Class B SEPP circuit are detected simultaneously (in real time), and are amplified and fed back as error signals.

Accordingly, the distortion at the SEPP output terminal is greatly reduced, the need for further temperature compensation of the idle current obviated, and the idle current stably maintained at a constant value immediately after application of power. The idle current is also maintained stabilized at a predetermined value when a large signal is inputted. Moreover, the output impedance of the circuit is significantly reduced, whereby loading of the preceding stage is greatly reduced. Still further, by employing a configuration of a non cut-off Class B SEPP circuit without switching distortion, a high performance SEPP circuit which has a small distortion factor and much higher stability than prior art circuits is obtained.

Figure 9:
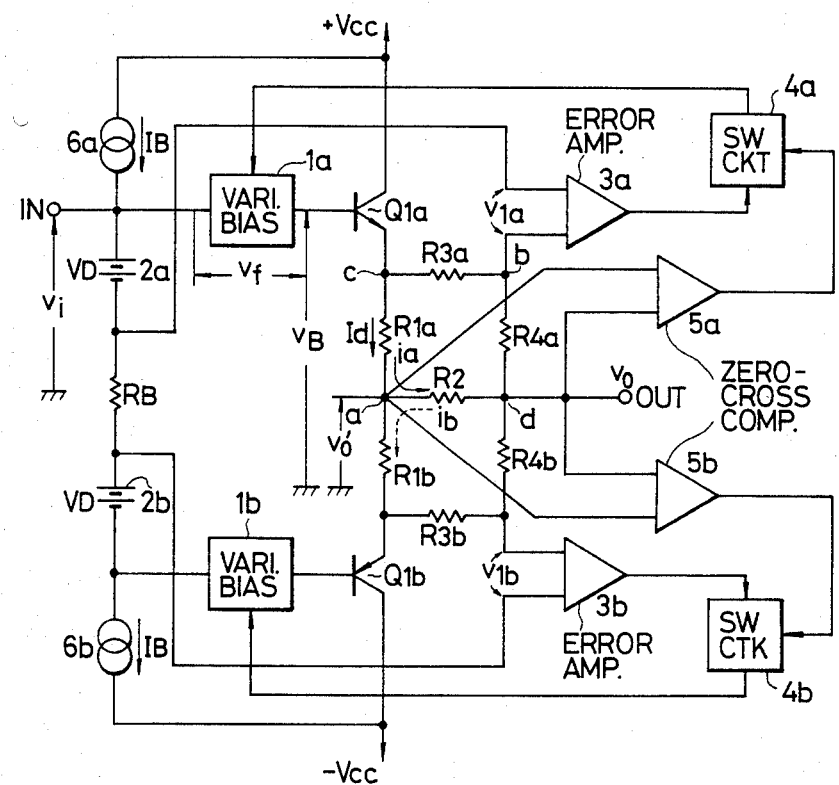
FIG. 9 is a circuit block diagram showing another preferred embodiment of the present invention.

FIG. 9 is a circuit block diagram showing another embodiment of the present invention. In FIG. 9, an input signal $v_i$ is applied not only as a base input to an output amplifying transistor $Q_{1a}$ (through a variable bias circuit $1a$ and for controlling the DC bias of the transistor $Q_{1a}$, but also as a base input of a second output amplifying transistor $Q_{1b}$ in the latter case through a constant voltage source $2a$, a resistor $R_B$, a constant voltage source $2b$ and a variable bias circuit $1b$. The transistors $Q_{1a}$ and $Q_{1b}$ are connected in an emitter-follower, Class B SEPP configuration with the emitters of the two transistors connected to one another through resistors $R_{1a}$ and $R_{1b}$. A signal $v_o'$ produced at the junction point between $R_{1a}$ and $R_{1b}$ is applied through a resistor $R_2$ to become a circuit output $v_o$, which may be used for driving a load such as a speaker (not shown). The resistors $R_{1a}$ and $R_2$ and the resistors $R_{1b}$ and $R_2$ are respectively connected in series between the corresponding emitters of the transistors $Q_{1a}$ and $Q_{1b}$ and the circuit output terminal. Resistors $R_{3a}$ and $R_{4a}$ and the resistors $R_{3b}$ and $R_{4b}$ are connected in parallel with the respective series-connected circuits, with the resistors $R_{3a}$ and $R_{4a}$ and the resistors $R_{3b}$ and $R_{4b}$ being connected in series with the corresponding emitters of the transistors $Q_{1a}$ and $Q_{1b}$. Therefore, two bridge circuits are formed, one by the resistors $R_{1a}$, $R_2$, $R_{3a}$ and $R_{4a}$, and the other by the resistors $R_{1b}$, $R_2$, $R_{3b}$ and $R_{4b}$.

One input to an error amplifier $3a$ is coupled to a common junction point b of the resistors $R_{3a}$ and $R_{4a}$, and one input to an error amplifier $3b$ is coupled to a common junction point of the resistors $R_{3b}$ and $R_{4b}$. As the other inputs to the error amplifiers $3a$ and $3b$, voltages level shifted by a constant voltage $V_D$ (from the constant voltage sources $2a$ and $2b$) above and below the input signal $v_i$ are employed, respectively. The error output signals from the error amplifiers $3a$ and $3b$ are applied as control signals to respective ones of the variable bias circuits 1a and 1b through respective switching circuits 4a and 4b. The switching circuits 4a and 4b supply the error outputs of the error amplifiers 3a and 3b selectively to the variable bias circuits 1a and 1b in response to outputs of zero-crossing comparators 5a and 5b which receive a voltage $v_o'$ from the point a and a voltage $v_o$ from the point d of the bridge circuits as inputs. Reference numerals 6a and 6b designate constant current sources.

The case of the positive half cycles of the input signal $v_i$ will firstly be considered. Assuming that the idle current of the transistor $Q_{1a}$ is $I_d$ and its output current is $i_a$, the voltage developed between points c and d will be:

$$V_{cd} = R_{1a} \cdot (I_d + i_a) + R_2 \cdot i_a \qquad (6)$$

Further, the voltage $V_{ba}$ developed between the points b and a can be expressed as:

$$V_{ba} = \frac{R_{4a}}{R_{3a} + R_{4a}} \cdot V_{cd} - R_2 \cdot i_a \qquad (7)$$

$$= \frac{R_{1a} \cdot R_{4a}}{R_{3a} + R_{4a}} \cdot I_d + \frac{R_{1a} \cdot R_{4a} - R_2 \cdot R_{3a}}{R_{3a} + R_{4a}} \cdot i_a.$$

Assuming that the condition $R_{1a}:R_2 = R_{3a}:R_{4a}$ is satisfied, i.e., that a bridge balance condition is maintained, equation (7) can be rewritten as:

$$V_{ba} = \frac{R_{1a} \cdot R_{4a}}{R_{3a} + R_{4a}} \cdot I_d = \frac{R_2 \cdot R_{3a}}{R_{3a} + R_{4a}} \cdot I_d. \qquad (8)$$

Thus, it can be seen that it is possible to detect the idle current $I_d$ flowing through the transistor $Q_{1a}$ by detecting the voltage between the points b and a. The same is of course true for the case of the negative half cycles.

When the voltage $V_a$ at the point a and the voltage $V_d$ at the point b satisfy $V_a \geq V_d$, that is, for positive half cycles or for a zero-valued input signal, the zero-crossing comparator 5a turns on the switching circuit 4a (conductive condition), while for $V_a < V_d$, that is, for negative half cycles, the comparator 5a turns off the switching circuit 4a (nonconductive condition). On the other hand, the zero-crossing comparator 5b operates complementarily such that the zero-crossing comparator 5b turns on the switching circuit 4b when $V_d \geq V_a$, and turns it off where $V_d < V_a$. Therefore, positive and negative feedback loops operate simultaneously since $V_a = V_d$ is satisfied when no signal is applied.

Assuming that the error signal inputs to the error amplifiers 3a and 3b are $v_{1a}$ and $v_{1b}$, the voltage $I_B R_B$ produced across the resistor $R_B$ is:

$$I_B R_B = v_{1a} + v_{1b} + 2 \cdot \frac{R_{1a} \cdot R_{4a}}{R_{3a} + R_{4a}} \cdot I_d. \qquad (9)$$

If the gain factors of the variable bias circuits 1a and 1b and the error amplifiers 3a and 3b are sufficiently large, the error signal inputs $v_{1a}$ and $v_{1b}$ will be small enough to be negligible. In this case, the following equation (10) can be obtained from equation (9):

$$I_d = \frac{R_{3a} + R_{4a}}{2 \cdot (R_{1a} \cdot R_{4a})} \cdot R_B I_B. \qquad (10)$$

Since the current $I_B$ is constant, the idle current $I_d$ will always be constant, irrespective of the presence or absence of an input signal.

Next, the relationship between the output signal voltage $v_o$ and the input signal voltage $v_i$ will be considered for positive half cycles. Assuming that the voltage between the input and output terminals of the variable bias circuit 1a is $v_f$, the base output voltage of the transistor $Q_{1a}$ is $v_B$, and the voltage between the base and emitter of the transistor $Q_{1a}$ is $V_{BE}$, the following equation is obtained:

$$\begin{aligned} v_i + v_f &= v_B \\ &= V_{BE} + R_{1a}(i_a + I_d) + v_o' \\ &= V_{BE} + R_{1a}(i_a + I_d) + v_o + R_2 \cdot i_a. \end{aligned} \qquad (11)$$

From equation (11), the following equation (12) can be obtained:

$$\begin{aligned} v_o &= v_i + v_f - \{R_2 \cdot i_a + R_{1a} \cdot (i_a + I_d) + V_{BE}\} \\ &= v_i + v_f - \{(R_{1a} + R_2)i_a + R_{1a} \cdot I_d + V_{BE}\}. \end{aligned} \qquad (12)$$

Further, the error signal output $v_{1a}$ from the error amplifier 3a can be expressed as:

$$v_{1a} = (v_i - V_D) - \left( v_o' + \frac{R_{1a} \cdot R_{4a}}{R_{3a} + R_{4a}} \cdot I_d \right). \qquad (13)$$

If the gain factor of the variable bias circuit 1a and the error amplifier 3a is $\alpha$ ($= v_f/v_{1a}$), the following equation can be obtained:

$$\begin{aligned} v_f &= \left\{ (v_i - V_D) - \left( v_o' + \frac{R_{1a} \cdot R_{4a}}{R_{3a} + R_{4a}} \cdot I_d \right) \right\} \cdot \alpha \\ &= \left\{ (v_i - V_D) - \left( v_o' + R_2 \cdot i_a + \frac{R_{1a} R_{4a}}{R_{3a} + R_{4a}} \cdot I_d \right) \right\} \cdot \alpha. \end{aligned} \qquad (14)$$

Substituting (14) into equation (12), the following equation is obtained:

$$v_o = v_i + \left\{ (v_i - V_D) - \left( v_o + R_2 \cdot i_a + \frac{R_{1a} \cdot R_{4a}}{R_{3a} + R_{4a}} \cdot I_d \right) \right\} \cdot \alpha -$$

$$\{(R_{1a} + R_2) \cdot i_a + R_{1a} \cdot I_d + v_{BE}\}.$$

Hence, $$(1 + \alpha)v_o = (1 + \alpha)v_i - \left( V_D + R_2 \cdot i_a + \frac{R_{1a} \cdot R_{4a}}{R_{3a} + R_{4a}} \cdot I_d \right) \cdot \alpha - \qquad (15)$$

$$\{(R_{1a} + R_2)i_a + R_{1a} \cdot I_d + V_{BE}\}$$

$$= (1 + \alpha)v_i - \left\{ (\alpha \cdot R_2 + R_2 + R_{1a})i_a + \right.$$

$$\left. \left( \alpha \cdot \frac{R_{1a} R_{4a}}{R_{3a} + R_{4a}} + R_{1a} \right) I_d + \alpha \cdot V_D + V_{BE} \right\}.$$

From equation (15), the following equation (16) is obtained:

$$v_o = v_i - \left\{ \left( R_2 + \frac{R_{1a}}{1+\alpha} \right) i_a + \left( \frac{\alpha}{1+\alpha} \cdot \frac{R_{1a} \cdot R_{4a}}{R_{3a} + R_{4a}} + \right. \right. \tag{16}$$

$$\left. \left. \frac{R_{1a}}{1+\alpha} \right) I_d + \frac{\alpha}{1+\alpha} V_D + \frac{1}{1+\alpha} \cdot V_{BE} \right\} .$$

If $\alpha$ is sufficiently large ($\alpha \gg 1$, or $\alpha \to \infty$), equation (16) can be rewritten as:

$$v_o = v_i - \left( R_2 \cdot i_a + \frac{R_{1a} \cdot R_{4a}}{R_{3a} + R_{4a}} \cdot I_d + V_D \right) . \tag{17}$$

Since $v_o = v_o' - R_2 \cdot i_a$, the following equation can be obtained:

$$v_o' = v_o + R_2 \cdot i_a \tag{18}$$

$$= v_i - \left( \frac{R_{1a} \cdot R_{4a}}{R_{3a} + R_{4a}} \cdot I_d + V_D \right) .$$

Since $I_d$ and $V_D$ are constant as stated above, the amount of distortion in $v_o'$ approaches zero. Since $R_2$ is a fixed-value resistor, the distortion of the circuit output also approaches zero. Similarly, for negative half cycles, the input signal voltage $v_i$ and the output signal voltage $v_o$ have an analogous relation.

Figure 10:
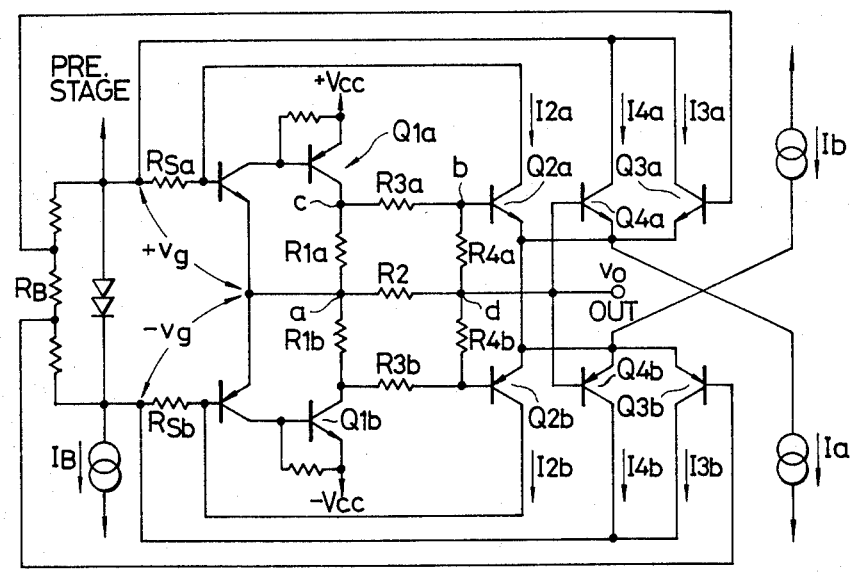
FIG. 10 is a circuit diagram showing a specific implementation of the circuit of FIG. 9.

FIG. 10 is a circuit diagram showing a specific implementation of the circuit of FIG. 9. In the FIG. 10 circuit, the same reference numerals as used FIG. 9 designate equivalent parts. Transistors $Q_{2a}$ and $Q_{3a}$ and transistors $Q_{2b}$ and $Q_{3b}$ constitute a positive side error amplifier 3a and a negative side error amplifier 3b, respectively. The resistors $R_{5a}$ and $R_{5b}$ constitute the variable bias circuits 1a and 1b, respectively. Transistors $Q_{4a}$ and $Q_{4b}$ form the the of zero-crossing comparators 5a and 5b, respectively.

During the positive half cycles, the transistor $Q_{4a}$ is turned off ($V_a \cong V_b > V_d$) and the transistors $Q_{2a}$ and $Q_{2b}$ operate normally. When no input signal is applied, the transistors $Q_{2a}$ and $Q_b$ operate normally with $I_{2a} \cong I_{3a} \cong I_{4a}$. For negative half cycles, $V_b < V_d$, and hence the transistor $Q_{4a}$ is turned completely on and the transistor $Q_{2a}$ cut off so as not to produce a voltage across the resistor $R_{sa}$. However, since the negative side transistors $Q_{2b}$ and $Q_{3b}$ are operating normally, current flows from them into the resistor $R_{sb}$ to produce a voltage across the resistor $R_{sb}$, whereby a feedback operation is effected.

Neither the operation of the preceding stage nor that of the SEPP circuit itself is adversely influenced by the presence or absence of the input signal since $I_a = I_{2a} + I_{3a} + I_{4a}$ and $I_b = I_{2b} + I_{3b} + I_{4b}$ are constant. Although the transistors $Q_{1a}$ and $Q_{1b}$ have an inverted Darlington connection, they may be connected in an ordinary Darlington configuration and FETs may be used as the active elements of the preceding stage.

Figure 11:
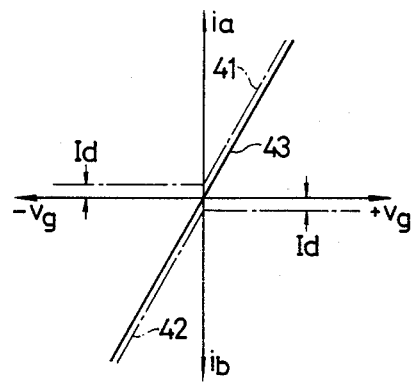
FIG. 11 is a graph showing a transfer characteristic of the circuit of FIG. 9.

FIG. 11 shows the transfer characteristic of a circuit according to the present invention in which a linear relationship is obtained by the positive side transfer characteristic 41 and negative side transfer characteristic 42. It may be appreciated from this graph that a non cut-off Class B SEPP circuit has been provided by the invention. (A voltage $v_g$ in FIG. 11 is $v_g = v_i - v_o'$.)

FIGS. 12 to 15 are circuit diagrams showing other embodiments of the present invention, in which the like reference numerals designate equivalent parts as in FIG. 10. In the embodiment shown in FIG. 12, the zero-crossing comparators 5a and 5b are omitted, and positive and negative variable bias circuits are constituted by a transistor $Q_{5a}$ and resistors $R_{5a}$ and $R_{6a}$, and a transistor $Q_{5b}$ and resistors $R_{5b}$ and $R_{6b}$, respectively. Further, positive and negative error amplifiers are constituted by transistors $Q_{6a}$ and $Q_{7a}$, and transistors $Q_{6b}$ and $Q_{7b}$, respectively. The operating points of the transistors $Q_{6a}$ and $Q_{6b}$ are set substantially at cut-off.

Figure 1:
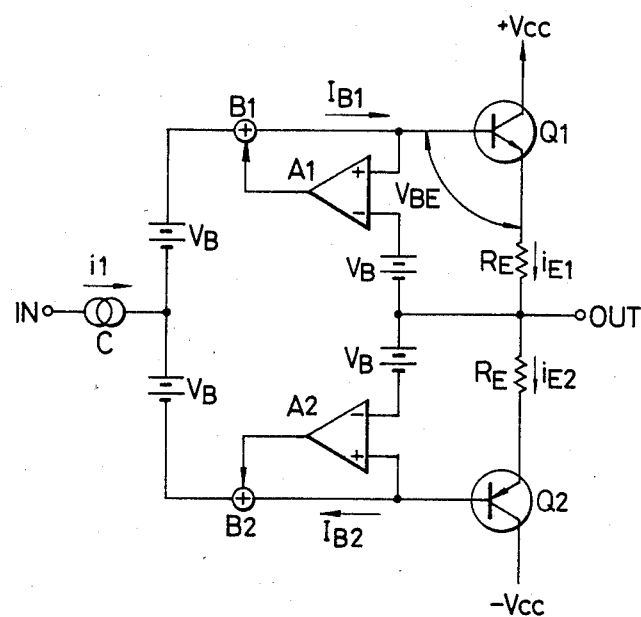
FIG. 1 is a circuit diagram showing an example of a conventional Class B SEPP circuit.
Figure 2:
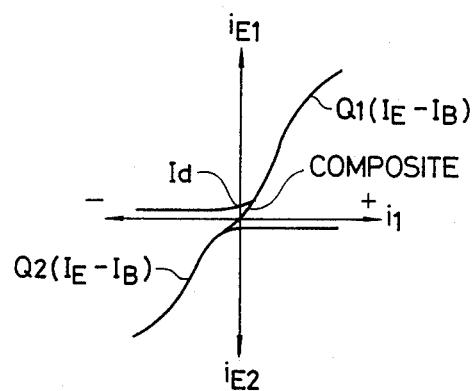
FIG. 2 is a graph showing a characteristic of the circuit of FIG. 1.
Figure 3:
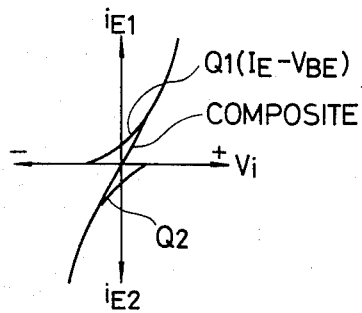
FIG. 3 is a graph showing a characteristic of another conventional circuit.
Figure 13:
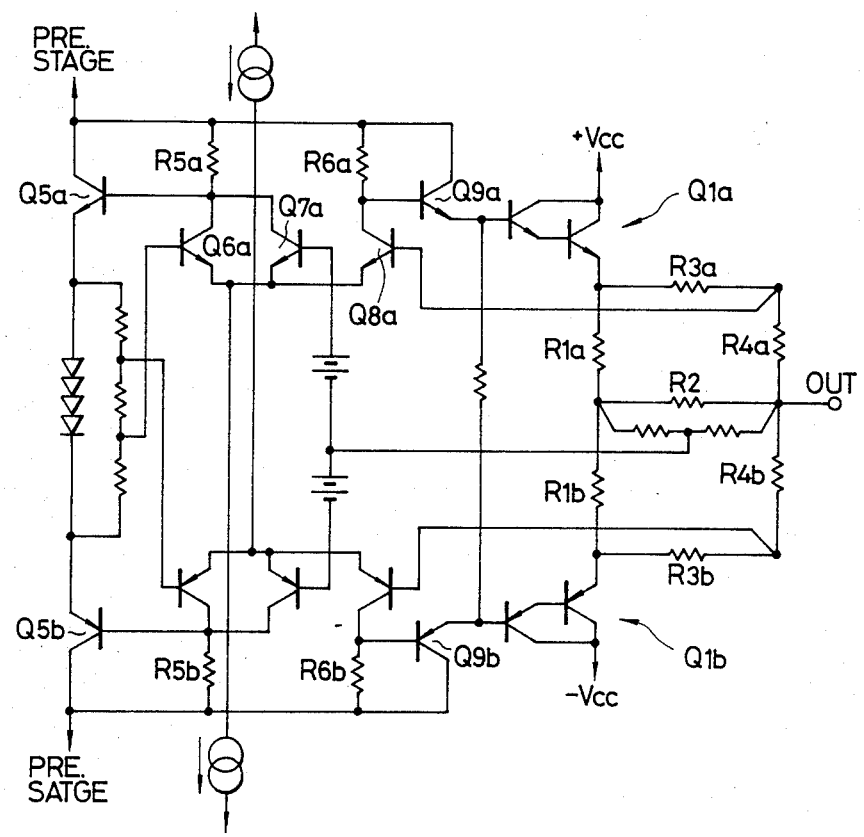

In an embodiment shown in FIG. 13, the zero-crossing comparators 5a and 5b of FIG. 1 are omitted, positive and negative variable bias circuits are constituted by transistors $Q_{5a}$ and $Q_{9a}$ and resistors $R_{5a}$ and $R_{6a}$, and transistors $Q_{5b}$ and $Q_{9b}$ and resistors $R_{5b}$ and $R_{6b}$, respectively. Error signal amplification for positive and negative idle components is effected by transistors $Q_{7a}$ and $Q_{8a}$ and transistors $Q_{7b}$ and $Q_{8b}$, respectively, while error signal amplification for positive and negative signal components is effected by transistors $Q_{5a}$ and $Q_{8a}$ and transistors $Q_{5b}$ and $Q_{8b}$, respectively.

Figure 14:
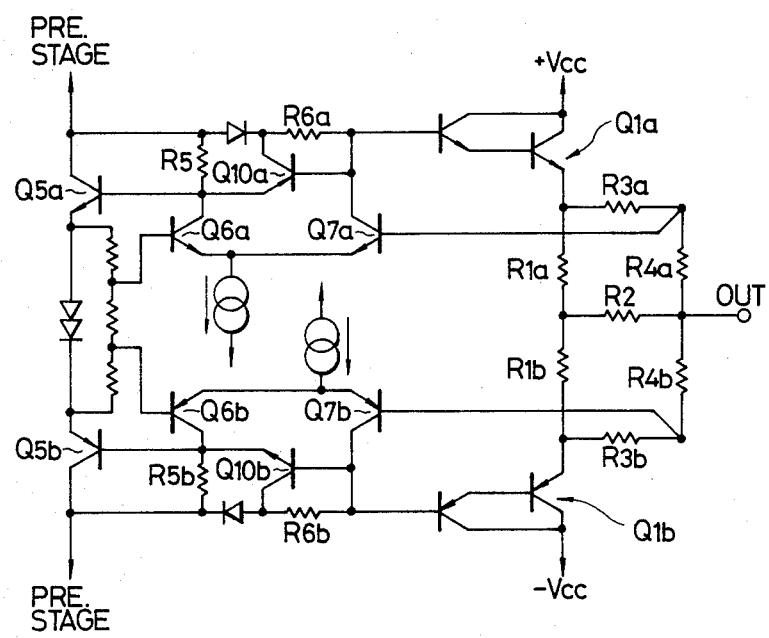

In an embodiment shown in FIG. 14, positive and negative variable bias circuits are constituted by a transistor $Q_{5a}$ and resistors $R_{5a}$ and $R_{6a}$, and a transistor $Q_{5b}$ and resistors $R_{5b}$ and $R_{6b}$, respectively. Positive and negative error signal amplifiers are constituted by transistors $Q_{6a}$ and $Q_{7a}$ and transistors $Q_{6b}$ and $Q_{7b}$, respectively. Transistors $Q_{10a}$ and $Q_{10b}$ function similarly to the zero-crossing comparators of the FIG. 9 embodiment. The operating points of these transistors are set substantially at cut-off. If the driving point is set on the emitter side of the transistors $Q_{5a}$ and $Q_{5b}$ in the circuits of FIGS. 12 to 14, an output signal without distortion will be produced.

Figure 15:
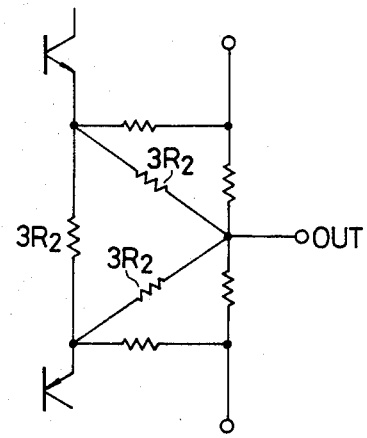
FIGS. 12 to 15 are circuit diagrams showing other embodiments of the present invention.
Figure 12:
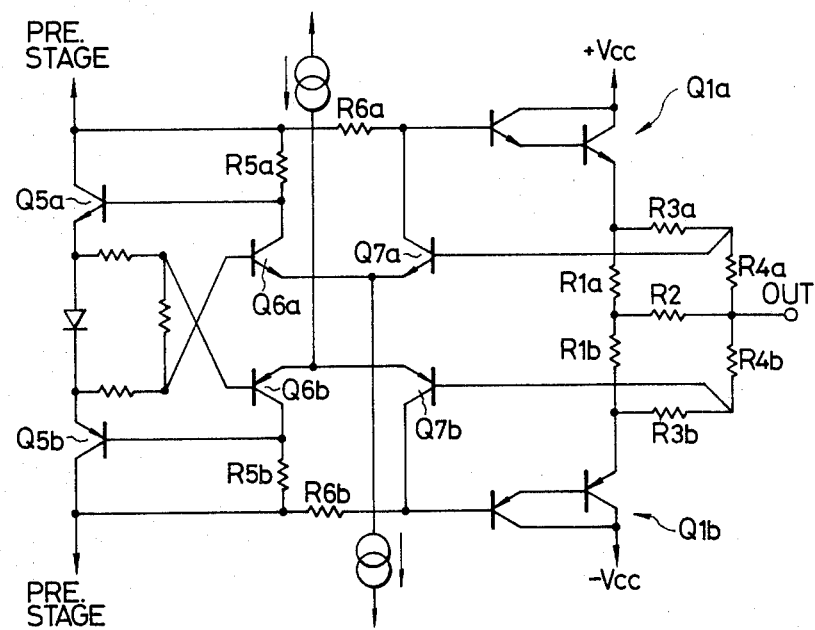

In the FIG. 15 embodiment, the bridge circuit of FIG. 12 is modified by Y-Δ conversion. Specifically, the resistors $R_{1a}$, $R_{1b}$ and $R_2$ of FIG. 12 have been replaced in the circuit of FIG. 15 by three resistors, each having a resistance $3R_2$.

As described in detailed above, according to the present invention, it is not necessary to add any temperature compensating elements such as a varistor or a thermistor, and no idle current adjustment is required, since the DC bias current of the amplifying elements which constitute the circuit are maintained constant. Moreover, a constant DC bias value is provided immediately after power is turned on. Thermal distortion is also eliminated. Further, since the transfer characteristic of the circuit is linear, all crossover distortion is reduced. Moreover, switching distortion is not produced since a non cut-off Class B amplifier configuration is used.

I claim:

1. An emitter-follower type SEPP circuit comprising: first and second amplifying elements connected in and biased in emitter-follower and Class B SEPP configurations; first and second load means coupled, respectively, between output electrodes of said first and second amplifying elements and an output terminal; first and second signal summing means having first inputs coupled to an input terminal and outputs coupled to input electrodes of said first and second amplifying elements, respectively; first and second error signal amplifying means provided for said first and second amplifying elements, respectively, each of said first and second error signal amplifying means having first and second noninverting input terminals and an inverting input terminal, said inverting input terminals being coupled to said output electrodes of said first and second amplifying elements, respectively, and said first and second error signal amplifying means having outputs coupled to second inputs of said first and second signal summing means, respectively; first and second means for level shifting an input signal present on said input terminal coupled between said input terminal and said first noninverting input terminals of said first and second error signal amplifying means, respectively; and first and second means for level shifting an output signal present on said output terminal coupled between said output terminal and said second noninverting input terminals of said first and second error signal amplifying means, respectively; wherein, while said first error signal amplifying means amplifies an error signal developed between its inverting input terminal and its first noninverting input terminal, said second error amplifying means amplifies an error signal developed between its inverting input terminal and its second noninverting input terminal, and while said second error amplifying means amplifies an error signal developed between its inverting input terminal and its first noninverting input terminal, said first error amplifying means amplifies an error signal developed between its inverting input terminal and its second noninverting input terminal.

2. The circuit of claim 1, wherein the voltages of each of said level shifting means are the same.

3. The circuit of claim 1, wherein said first and second load means each comprise a resistive load.

4. The circuit of claim 1, wherein said first and second load means each comprise a current mirror circuit.

5. The circuit of claim 1, wherein said first and second amplifying elements each comprise a bipolar transistor.

6. The circuit of claim 1, wherein said first and second amplifying elements both comprise bipolar Darlington-connected transistors.

7. An amplifier circuit comprising: an amplifying element; a resistive bridge circuit coupled between an output electrode of said amplifying element and an output terminal, said bridge circuit comprising first and second resistors, said first and second resistors being connected in series with one another between said output terminal and said output electrode of said amplifying element; error signal amplifying means for providing an error signal representing a difference between the levels of an input signal to said amplifying element and a signal detected by said bridge circuit; and bias varying means for controlling a DC bias of said amplifying element in accordance with an error output signal produced by said error amplifying means.

8. The circuit of claim 7, wherein said bridge circuit further comprises third and fourth resistors coupled in series with one another and in parallel with said first and second resistors, and wherein said signal detected by said bridge circuit is produced at a junction between said third and fourth resistors.

9. The circuit of claim 7, wherein said bias varying means comprises a comparator having first and second input terminals coupled to a junction between said first and second resistors and to said output terminal, respectively; and a switching circuit for selectively connecting said output of said error amplifying means to an input electrode of said amplifying element in response to an output of said comparator.

10. The circuit of claim 7, further comprising means for level shifting said input signal imposed between said input terminal and said error emplifying means.

* * * * *